United States Patent

Schuchman et al.

[11] Patent Number: 5,577,066
[45] Date of Patent: Nov. 19, 1996

[54] CHARGE-COUPLED-DEVICE BASED DATA-IN-VOICE MODEM

[75] Inventors: Leonard Schuchman; Aaron Weinberg, both of Potomac, Md.

[73] Assignee: Stanford Telecommunications, Inc., Reston, Va.

[21] Appl. No.: 242,103

[22] Filed: May 13, 1994

[51] Int. Cl.⁶ ........................................... H04B 1/38
[52] U.S. Cl. .................. 375/222; 455/143; 348/388; 332/103
[58] Field of Search ........................ 375/222–223, 375/260, 267, 283, 308, 340–341, 343, 347, 350; 364/724.04, 724.16; 379/93, 100; 455/143; 348/388–389; 332/103

[56] References Cited

U.S. PATENT DOCUMENTS

| | | | |
|---|---|---|---|
| 4,145,655 | 3/1979 | Caudel et al. | 375/219 |
| 4,336,613 | 6/1982 | Hewes | 375/223 |
| 4,542,475 | 9/1985 | Acampora | 364/724.16 |
| 4,630,099 | 12/1986 | Rzeszewski | 348/389 |
| 5,151,779 | 9/1992 | Kanatsugu et al. | 348/389 |
| 5,483,549 | 1/1996 | Weinberg et al. | 375/200 |

*Primary Examiner*—Young T. Tse
*Attorney, Agent, or Firm*—Jim Zegeer, Esq.

[57] ABSTRACT

A data-in-voice modem is disclosed using charge coupled devices. Unique features include: (1) Baseband-to-IF upconversion to enable CCD-based demod/processing; (2) All analog (no analog-to-digital A/D required); option for post-CCD A/D; (3) Additional on-chip functions; (4) Stand-alone, CCD-based high-rate modem over telephone lines; and (5) CCD-based cable-tv/multimedia processing, via baseband-to-IF upconversion, followed by IF-sampled CCD processing.

2 Claims, 16 Drawing Sheets

CHARGE-COUPLED-DEVICE BASED DATA-IN-VOICE MODEM

REFERENCE TO RELATED APPLICATIONS

The present invention is related to the data-in-voice modem disclosed in Ser. No. 08/079,810 and to U.S. Pat. No. 5,483,549, entitled "RECEIVER HAVING CHARGE-COUPLED-DEVICE BASED RECEIVER SIGNAL PROCESSING", filed Mar. 4, 1994, both of which are incorporated herein by reference.

The present invention is directed to a charge coupled device (CCD) based data-in-voice modem in which there is a baseband-to-IF upconversion to enable the charge coupled device to demodulate and process signals. It is an all-analog device (e.g., no A/D conversion is required) but, there can be an analog-to-digital conversion (A/D) conversion after the CCD.

Moreover, the CCD can have additional on-chip functions performed, such as mixers and the like. The invention provides a stand-alone CCD based high rate modem for use over telephone company lines. Moreover, the invention provides a CCD based cable-TV multimedia processing via baseband-to-IF upconversion followed by IF-sampled CCD processing.

BACKGROUND AND BRIEF DISCUSSION OF THE INVENTION

As the use of digital communications has increased over the past few decades, engineers have been faced with the challenge of building receivers that are of a practical size and reasonable cost. While driven in the past to reduce size and cost, a large portion of the marketplace was composed of users—such as the military—that required small to moderate quantities of a particular receiver model. In addition, requirements for substantial capability/functionality and extreme environmental/reliability characteristics resulted in receivers that were large and bulky: albeit they were virtually "bullet-proof". The marketplace has now changed and a large part of the user community is composed of the commercial sector. As such, the requirements placed on communication equipment have also changed with increased pressure to meet price points acceptable for high volume product markets. Within this market, simpler receivers with very focused functionality, low power consumption, and reduced size are desired, and the object of the invention is to provide receivers meeting this criteria.

The receiver disclosed herein is called the Integrated Receiver (IR.) The name reflects both its inherent nature for overlapping several receiver processes within a common processing path and its amenability for implementation using highly integrated circuitry. The IR's operating advantages stem from its unique signal processing characteristics that are achieved through novel use of charge coupled devices (CCD) technology and integrated tracking loop techniques.

CCD technology has been used for many years. Probably, its most notable application has been in the camera industry. However, recent advances in CCD design and fabrication have led designers to consider new uses for this technology. For example, see Weinberg et al. U.S. Pat. No. 5,126,682, which relates to a demodulation system incorporating CCD devices, which is incorporated herein by reference. The CCD is a combination of analog and digital circuitry whose properties exploit the best from both worlds. Its analog input matches well with wideband and narrow-filtered signals provided by receiver front-ends and the device is capable of directly producing a digital output when integrated with an A/D converter. Furthermore, the device may be controlled and clocked digitally thereby providing a natural interface with a system processor. When configured as a transversal filter (see patent 5,126,682), the CCD offers several key features including:
Wideband input.
Wide input dynamic range.
Variable, low-to-high clocking speeds, KHz-to-$\geq$100 MHz.
Variable/fixed tap weights.
Multibit tap weights.
Large number of stages.
Programmable length control.
Auxiliary, unique charge domain processing functions.

Given the features noted above, the CCD becomes an extremely useful device for receivers as disclosed herein. Through its proper use, the device can:
Filter,
Frequency translate and modulate or demodulate,
Equalize
Store samples,
Decimate,
Despread,
Tune,
Amplify/Attenuate,
incoming signals. The IR exploits the CCD's features so as to simplify digital signal processing requirements within the receiver.

The Present Invention

The present invention provides a data-in-voice modem for coupling voice and data signals to and from a telephone circuit. It provides for the receiver portion and upconverter means for receiving input baseband signals including voice and data signals and, upconverting said baseband signals to an intermediate frequency (IF) signal. A single integrated circuit chip having a first CCD channel having a first CCD filter device with intermediate taps for IF sampling with a fixed sampling rate and predetermined tap weights, and an envelope detector coupled to receive the output of the first CCD device. The first CCD device has a predetermined frequency data notch in the passband thereof and outputing a voice signal from said first CCD channel.

A second CCD channel having a second CCD filter device coupled to receive the intermediate frequency signal and adapted to perform as a bandpass filter for the predetermined data notch, IF sampling with predetermined sampling and tap weights and detector means for outputing a data signal from said second CCD channel. For the modulator portion, it provides an analog voice signal channel having means for upconverting the analog voice signal to a predetermined intermediate frequency IF, a third CCD channel having a CCD with intermediate taps for IF sampling with a further fixed sampling rate and predetermined tap weights. Means for inputing a differential phase shift key (DPSK) signal encoded data signal, means for upconverting the DPSK signal to a predetermined intermediate signal, plus an offset S, and a bandpass filter means connected to the upconverter. The outputs of the third CCD channel and said bandpass filter means are added to and provide a summed output signal constituting a data-in-voice signal and a low pass filter means connects the data-in-voice signal to a transmitter.

DESCRIPTION OF THE DRAWINGS

The above and other objects, advantages and features of the invention will become more apparent when considered with the following specification and accompanying drawings wherein.

DETAILED DESCRIPTION

The specific composition of an Integrated Receiver is very dependent on the targeted application. Data rates, coding requirements, performance (e.g., acquisition speed), FDMA/TDMA/CDMA operation, carrier frequency, tuning range, input dynamic range, configurability, reliability, environment, unit cost, etc. all have a bearing on design selections. Because there are so many variables to consider, the following IR description is constrained to the most fundamental aspects of the invention.

Figure 1:
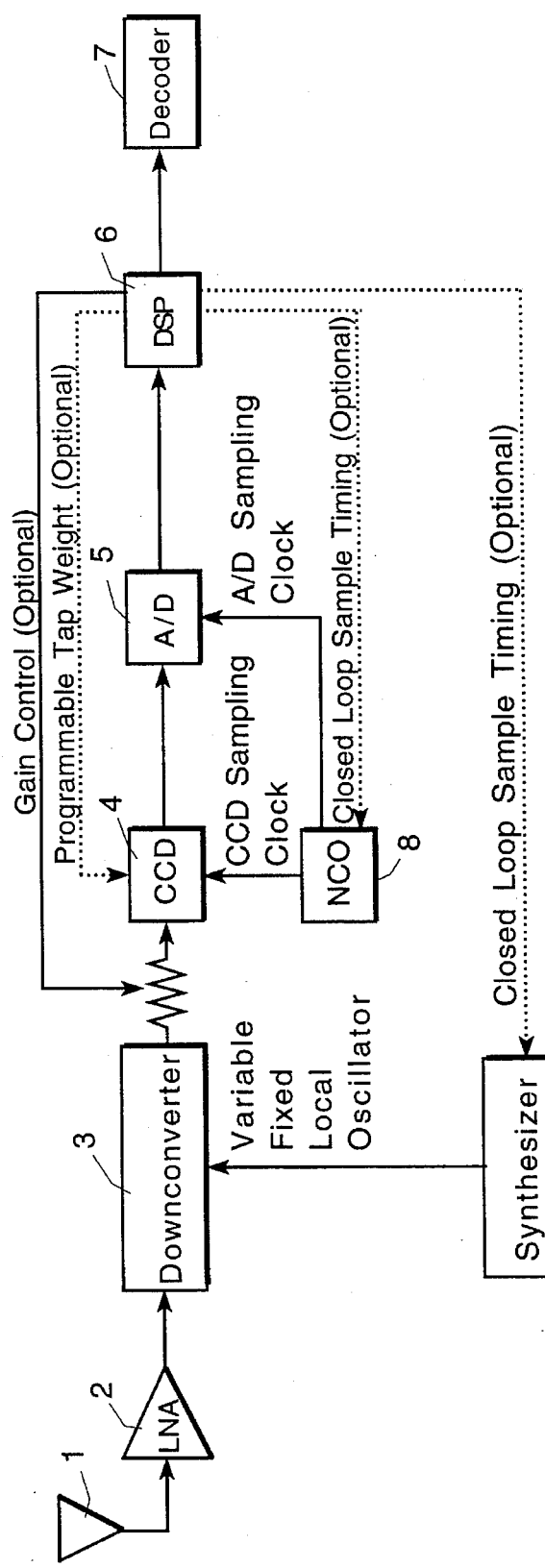
FIG. 1 is a diagrammatic overview of the fundamental Integrated Receiver architecture incorporating the invention.

The fundamental IR architecture is depicted in FIG. 1. Note that a specific IR implementation might require fewer (or perhaps additional) components. For instance, downconverter 3 and CCD 4 (and digital signal processor (DSP) 6 in some instances) have a frequency translation capability. As a result, certain applications could have carrier frequency assignments that would preclude one or more of these components while still using IR signal processing. In contrast to these reductions in IR complexity, one may add/enhance components in order to satisfy other requirements. For instance, built-in performance monitoring, higher order modulation (with perhaps frequency hopping), and special interfacing circuitry could all be added within the scope of the IR architecture of this invention.

Antenna 1 and Low Noise Amplifier (LNA) 2 form the IR's front end. Their selection is based upon link budget calculations for a specific application. Output from LNA 2 is passed to Downconverter 3. Downconverter 3 can be implemented in many ways. For example, it can translate the received RF by mixing with a fixed or variable local oscillator (LO) from Synthesizer 9. It could also use a sample and hold technique to subsample the RF and produce an aliased signal at the desired IF. In addition to frequency translation, the downconverter can provide gain control and filtering as required.

The IF produced by Downconverter 3 is passed to CCD 4. The CCD is clocked by Numerically Controlled Oscillator (NCO) 8. The CCD may also accept tap weights from Digital Signal Processor (DSP) 6 in some applications. The analog output of the CCD is passed to Analog to Digital Converter (A/D) 5. Finally, the digitized signal is passed to DSP 6. DSP 6 executes the IR acquisition and tracking algorithms and updates feedback paths to Synthesizer 9 and NCO 8 as needed. Tap weight generation is also performed by DSP 6 as well as generating all control signals required for receiver operation. Decoder 7 performs any block or viterbi decoding, descrambling, differential decoding and deinterleaving that may be required.

Figure 2:
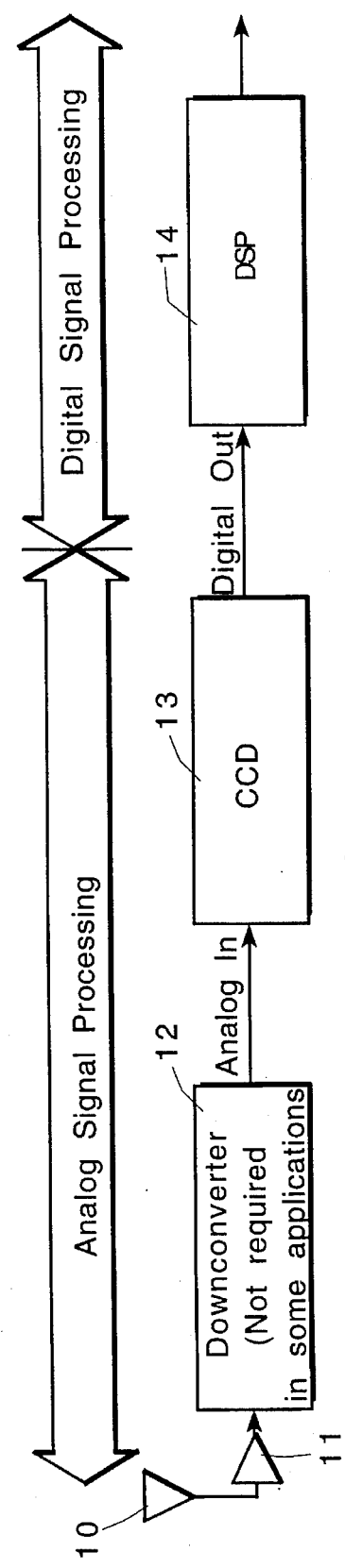
FIG. 2 is an overview of the Integrated Receiver signal processing according to the invention.

An overview of the signal processing performed within the IR architecture of this invention is depicted in FIG. 2. This figure illustrates a receiver configuration employing IF sampling. Note that the single signal path beginning with antenna 10, amplifier 11, and extending through CCD 13 provides all the input necessary to perform the digital signal processing. This is unlike classical designs that would separate the various acquisition and tracking functions thereby requiring additional circuitry to process the received signal.

Figure 3:
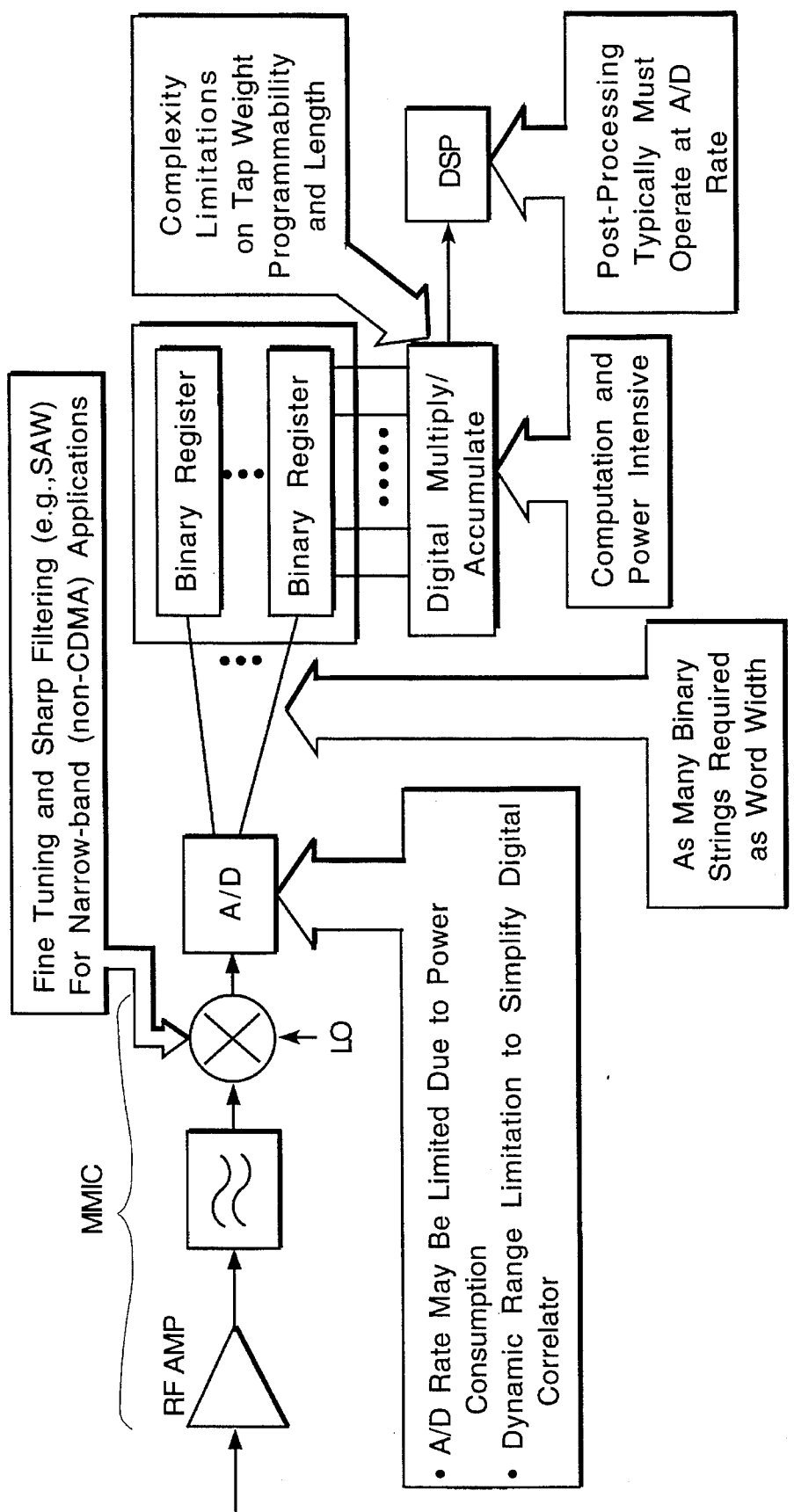
FIG. 3 shows the characteristics of conventional digital matched filtering and correlation.
Figure 4:
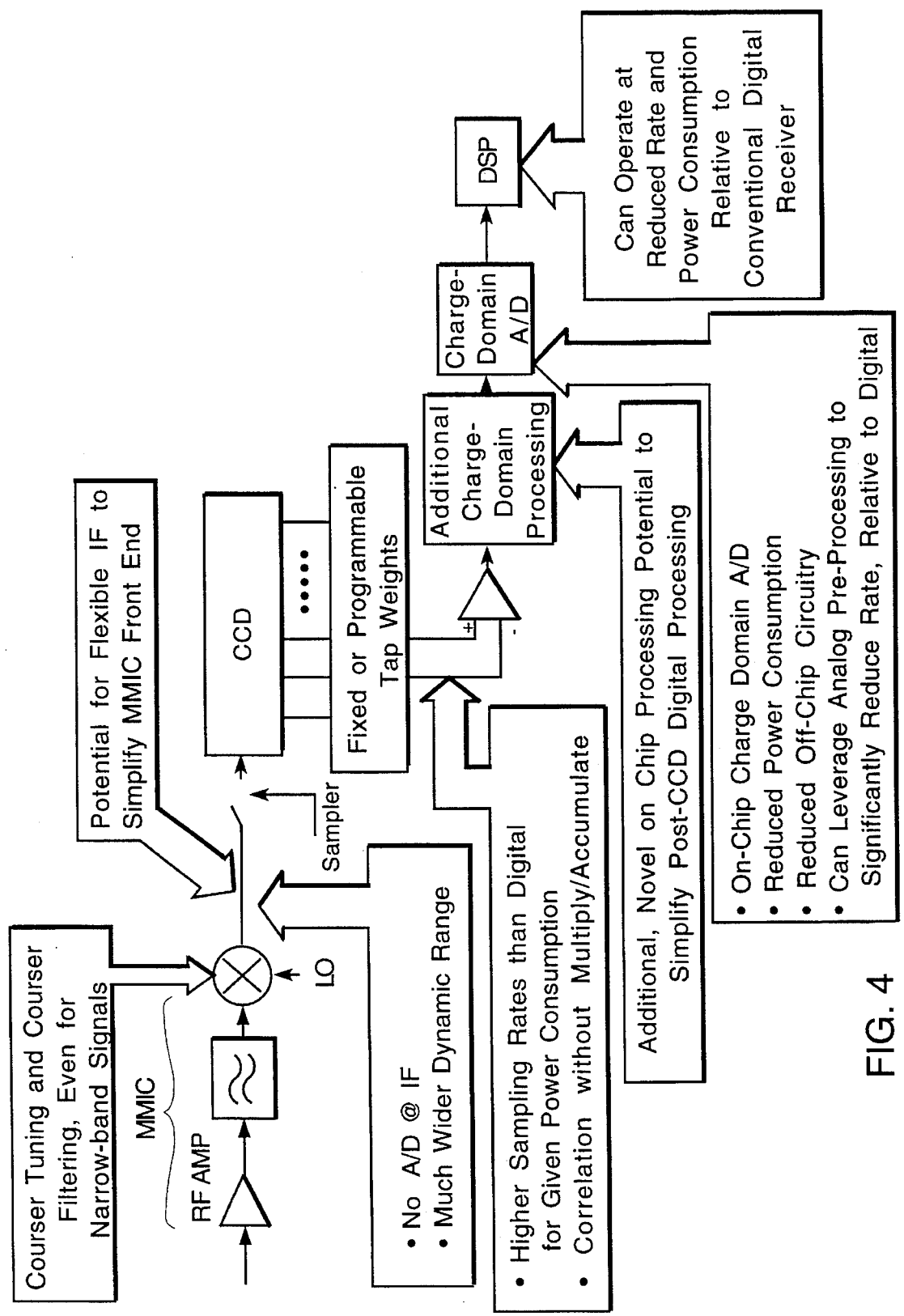
FIG. 4 shows the characteristics of CCD matched filtering and correlation.

Extensive signal processing is accomplished with the CCD. For example, a 512 stage CCD with 256 tapped stages performs the equivalent of about 6 billion floating point multiply/accumulate operations each second when clocked at a 24 MHz rate. This high processing capacity enables the CCD to collapse the bandwidth of its input signal so as to dramatically slow down processing rates of the subsequent digital signal processing. FIGS. 3 and 4 contrast conventional digital technology and CCD technology for receiver applications:

FIG. 3, showing the characteristics of conventional digital processing, and FIG. 4, diagrammatically charts the advantages of CCD matched filtering and correlation according to this invention, each arrowed box pointing out the advantage or feature.

The following is a summary of the key functions performed by the CCD.

Demodulation

Figure 5:
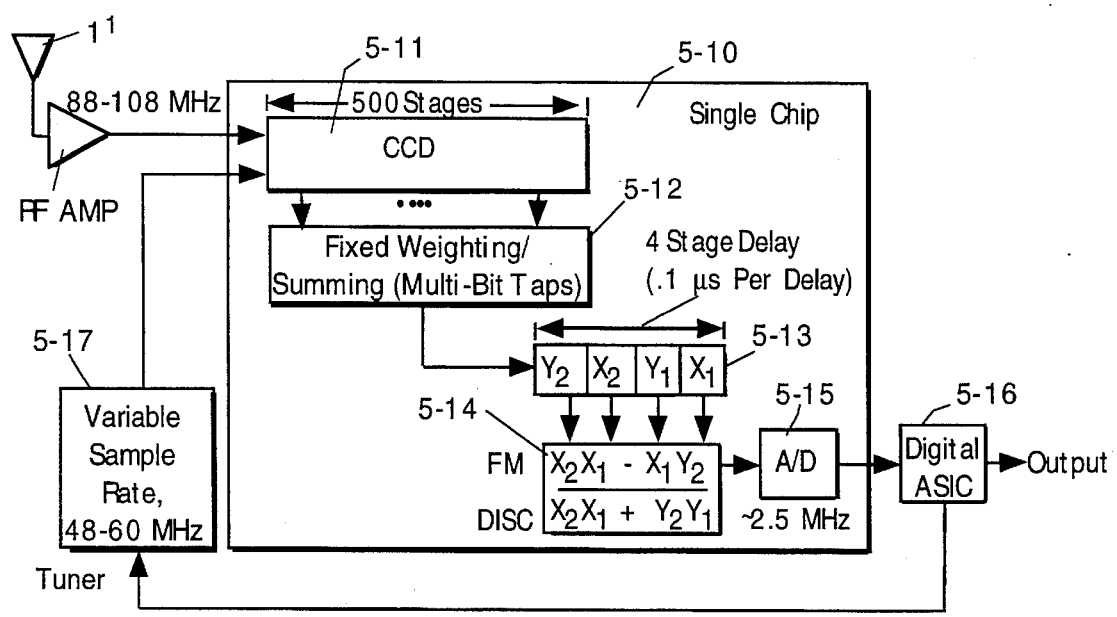
FIG. 5 illustrates a CCD-based FM receiver design.

Because of the CCD's variable clocking rate, the recovered waveform can be aligned within the CCD so that the tap weights cancel the carrier component. This process acts to demodulate the recovered waveform. For example, the carrier component of a BPSK waveform can be removed by correlating its peaks and zero crossings with tap weights of the form $a_1, 0, +a_2, 0, -a_3, 0, +a_4, 0, \ldots$ . Note that this sequence generates both inphase and quadrature components within a single path. In general, the same applies for higher order modulation. Additionally, discriminators may also be imbedded within the CCD for detection of analog modulated signals. FIG. 5 illustrates an example of this. FIG. 5 shows a single integrated circuit CCD 5–10 having a CCD portion 5–11 having, for example, 500 stages with the stages being fed to a fixed weighting/summer 5–12 whose output is fed to a four stage delay portion 5–13, which, in turn, supplies an FM discriminator portion 5–14. The analog output is fed to analog-to-digital converter portion 5–15. The output from chip 5–10 is supplied to a digital application specific integrated circuit chip 5–16. One output is supplied to tuner 5–17, which provides a variable sampling rate (48–60 MHz) to the CCD portion 5–11. Thus, this single CCD chip incorporates charge domain processing and embeds multiple functions in the single chip and eliminates components. There is no mixing and narrow band filtering. The CCD serves as the downconverter/narrow band-tuned FIR filter, FM discriminator on chip (charge domain) and the chip incorporates analog-to-digital (A/D) on chip and at a low rate due to CCD pre-processing. The single chip can also serve as the front-end for multiple applications, embedded in tailored application specific integrated circuit chips, for example, as in a mono or stereo commercial FM receiver, for sub-carrier processing (e.g., for IVHS). The invention can be used in digital audio broadcast systems employing frequency hopping as disclosed in Schuchman et al. U.S. Pat. No. 5,283,780, incorporated herein by reference.

Filtering

The CCD is a tapped analog delay line. This is the same configuration that is used for correlators and finite impulse response filters. The filter characteristics of this device are determined by the tap weights contained in the CCD. Filtering for PN despreading using ternary tap weights provides a SinX/X roll-off while multibit tap weights may be used for sharp cut-off to guard against adjacent channel interference—important for a broad range of cellular and PCS/PCN applications (GSM, IS-54, IS-95, etc.). Further influencing the filter is the clock rate applied to the CCD which can be used to adjust the filter bandwidth and center frequency. Adjustment of the filtering characteristics by changing the sample rate is an important feature in multi-channel applications. And, may further reduce complexity and cost by eliminating expensive filter components (e.g., saw filters).

Decimation

Typically, the CCD is configured to span a portion of a symbol period. In some cases it may be necessary to sample the recovered waveform at a rate much higher than the symbol rate (e.g. CDMA signals where the chip rate determines the sample rate). The CCD permits decimation of the waveform by collapsing the output rate of the CCD by a factor that is proportional to the length of the CCD. Thus the CCD may be clocked at a very high rate but its effective output rate is much closer to the actual symbol rate. Thereby significantly reducing the digital post-processing rate and, hence, complexity and power consumption as well.

Sample Storage

The CCD is capable of holding analog signal samples for relatively long periods of time. This feature enables designers to collect samples at very high rates and then read them from the CCD at substantially lower rates. This can be accomplished by suspending the CCD clock once the samples are collected or by adding sample and hold circuits after the CCD summation node for the purpose of capturing only selected data.

Despreading

CDMA applications require correlation of a recovered waveform with a locally generated code sequence. While this process is an extremely effective communication technique, the process of aligning the codes during the initial acquisition phase can be very computationally intensive; the CCD's correlation architecture is well suited for this task. Programmable ternary (or higher order) weighting at the taps facilitates code alignment and length control for matching to the data rates of interest.

Tuning

Communication systems with multiple adjacent channels are quite common. Channel selection is typically accomplished by adjusting the receiver LO so as to move the desired channel into the pass band. When using IF sampling techniques, the CCD is able to perform this function as well. By adjusting the CCD's clock rate, it is possible to match with the recovered waveform's carrier and thereby select a desired channel. This effectively tunes to filter to match the selected carrier frequency. This process may greatly reduce or even eliminate the need for a variable LOs.

Amplify/Attenuate Eliminate D-C Bias

The CCD does much of its signal processing in the analog domain. As such, it is possible to adjust signal levels (and biases) as needed. Functions such as gain control may benefit from this feature. Also, the alternating polarity tap weights of CCD IF sampling automatically eliminates DC biases as part of the demodulation process.

Once the recovered waveform exits the CCD, it is digitized and buffered. The demodulated signal samples are then selectively collected by the DSP. The DSP then processes the samples according to its acquisition and tracking algorithms. FIGS. 8–11 disclose novel and very efficient set of algorithms which permit use of a common set of recovered samples so as to simplify the hardware design while achieving excellent receiver performance.

Figure 6A:
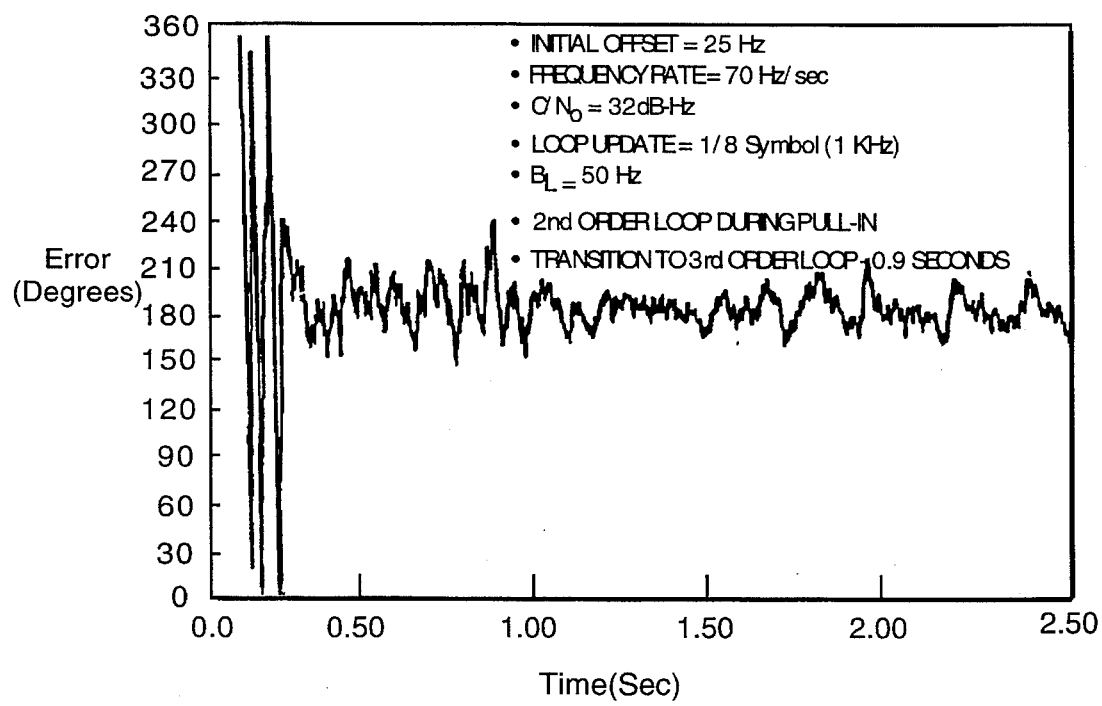
FIGS. 6a, 6b and 6c show data, collected from an Integrated Receiver prototype for a CDMA application, that illustrates closure of the three tracking loops pseudonoise (PN, carrier, and symbol) using the common output provided by the matched filter.
Figure 6B:
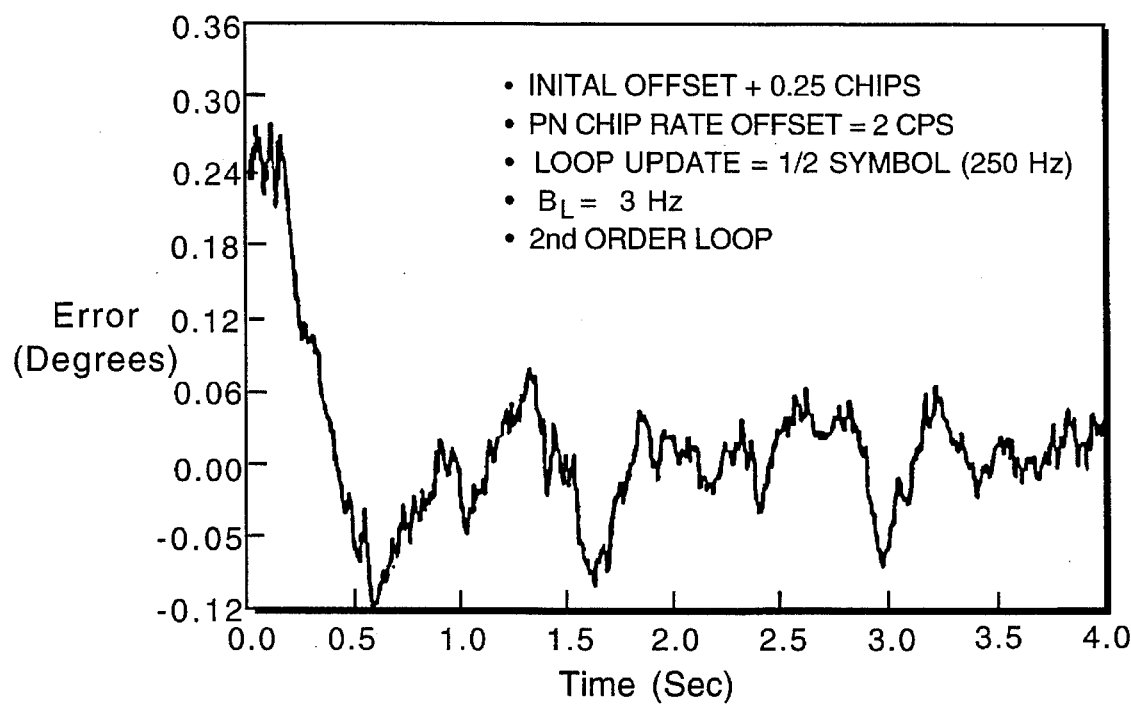
Figure 6C:
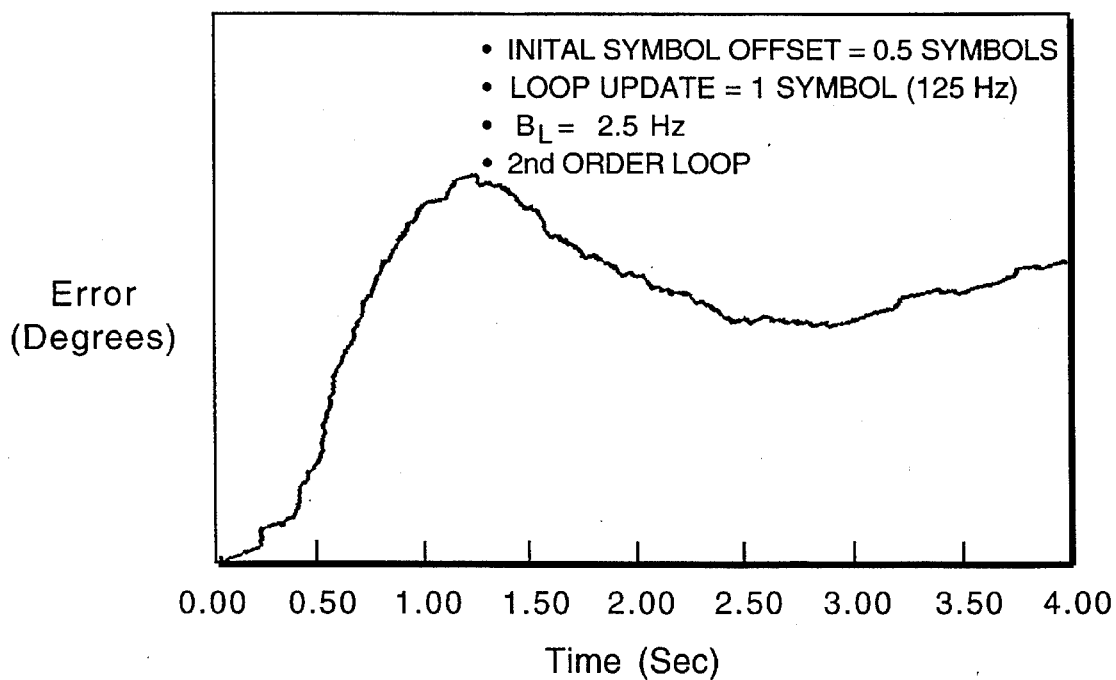
Figure 7:
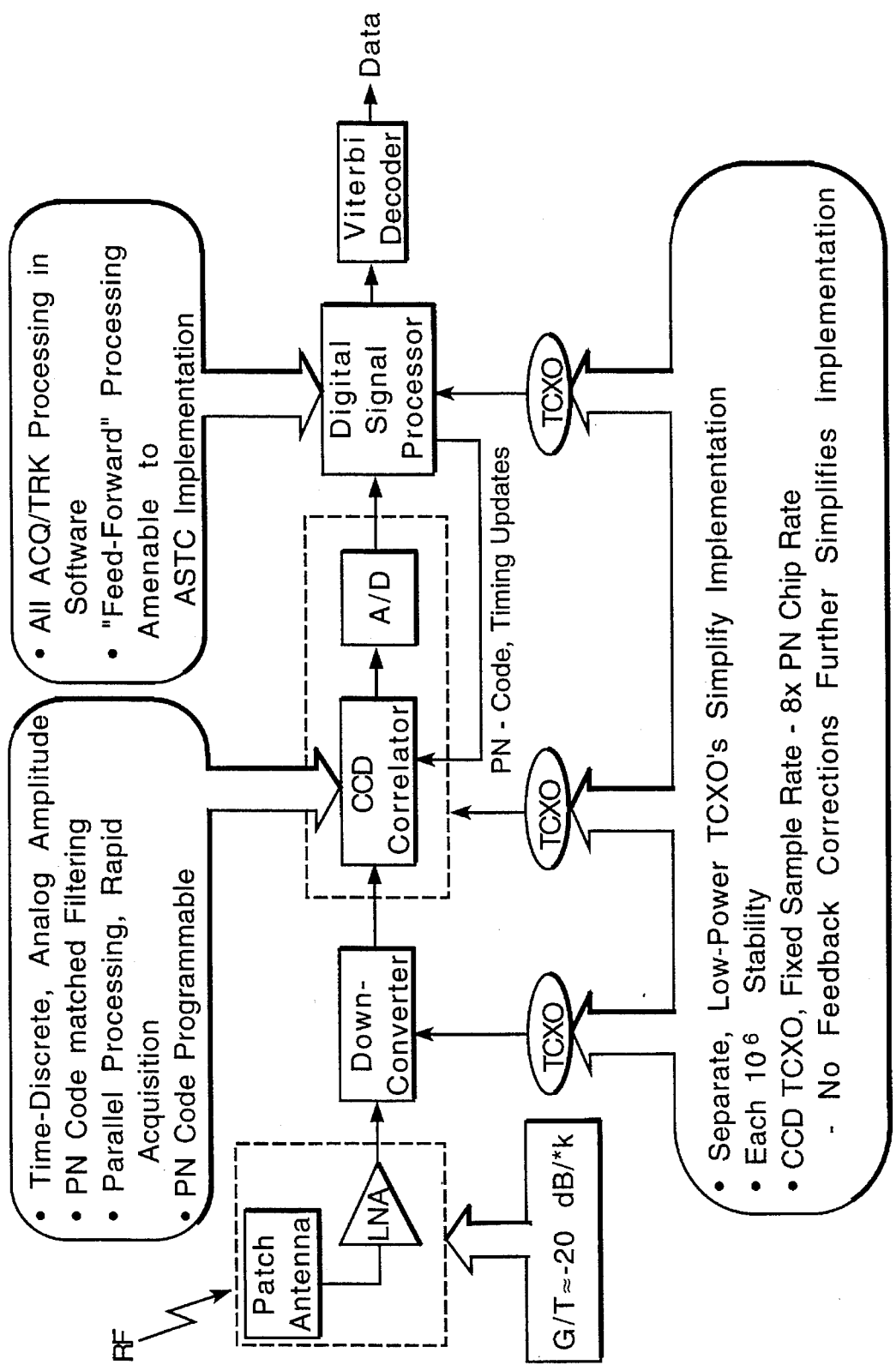
FIG. 7 is an example of an integrated receiver embodiment of the invention designed for a CDMA application.

In a spread spectrum application, the receiver would first execute its PN acquisition routine followed by carrier acquisition. Once signal acquisition were completed, these routines could be disabled and the tracking routines enabled. At this point all three tracking loops begin to close in on the received signal. FIGS. 6a, 6b and 6c illustrate the ability of the IR to perform this task. Note the FIG. 6A is the first to converge thereby commencing coherent carrier tracking. Soon thereafter, the PN tracking loop (FIG. 6B) is closed and followed by the symbol sync (FIG. 6C.) Once symbol sync is attained, decoding (if present) is activated and data recovery is initiated. The net effect of this integrated process is faster signal recovery at the start of a service interval while making efficient use of the receiver circuitry.

FIGS. 7 through 11 depict the architecture and signal processing for a CDMA compatible Integrated Receiver. Note that variations of this example should yield IR designs suitable for TDMA, FDMA, AM, FM and other communication schemes. The example receiver (see FIG. 7) operates at S-band with a 3 MCPS PN code rate and BPSK modulation. The use of fixed clocks (temperature compensated crystal oscillator (TCXO) is emphasized in this example so as to reduce synthesizer complexity and to restrict the digital signal processor to a single block to support circuit integration objectives.

Figure 8:
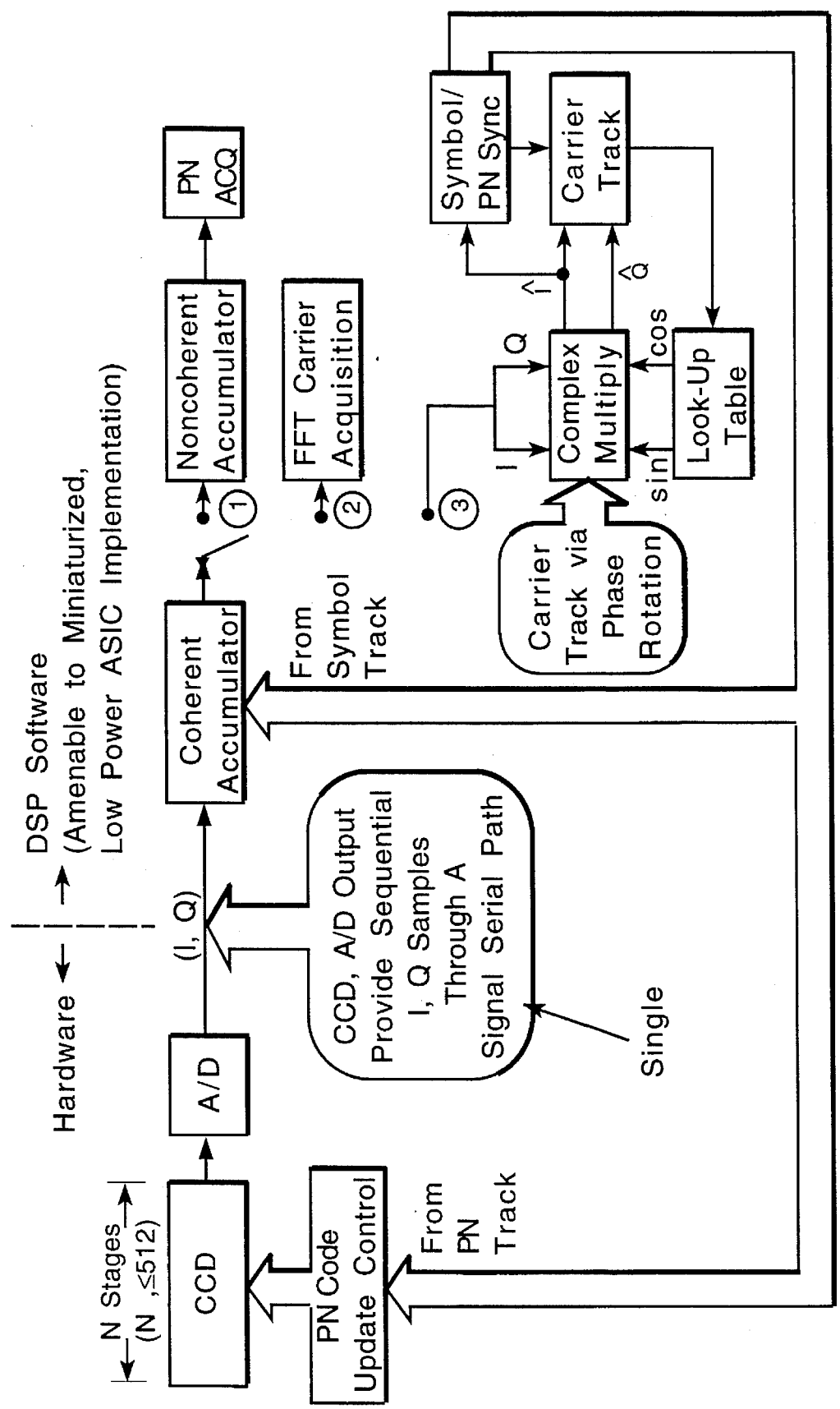
FIG. 8 is an overview of the signal processing performed by another embodiment receiver.

An overview of the signal processing for the CDMA receiver examples is illustrated in FIG. 8. Note that the processing sequence discussed earlier is followed in this example: PN acquisition, carrier acquisition and finally signal tracking. The PN acquisition process (illustrated in FIG. 9) is greatly aided by the CCD. In this example, the recovered waveform is sampled at 8 times the PN chip rate. The sample rate is application dependent. Samples rates of twice the chip rate are typical for many applications. The resolution resulting from this sampling yields uncertainty of $\frac{1}{16}$th of a chip. The samples are collected in a 256 stage accumulation for coherent accumulation over a half symbol duration. The results of coherent accumulation then pass through a squaring operation (to remove sign) and are then accumulated non-coherently. Finally, the PN acquisition algorithm selects the largest value of all the correlated states.

Figure 9:
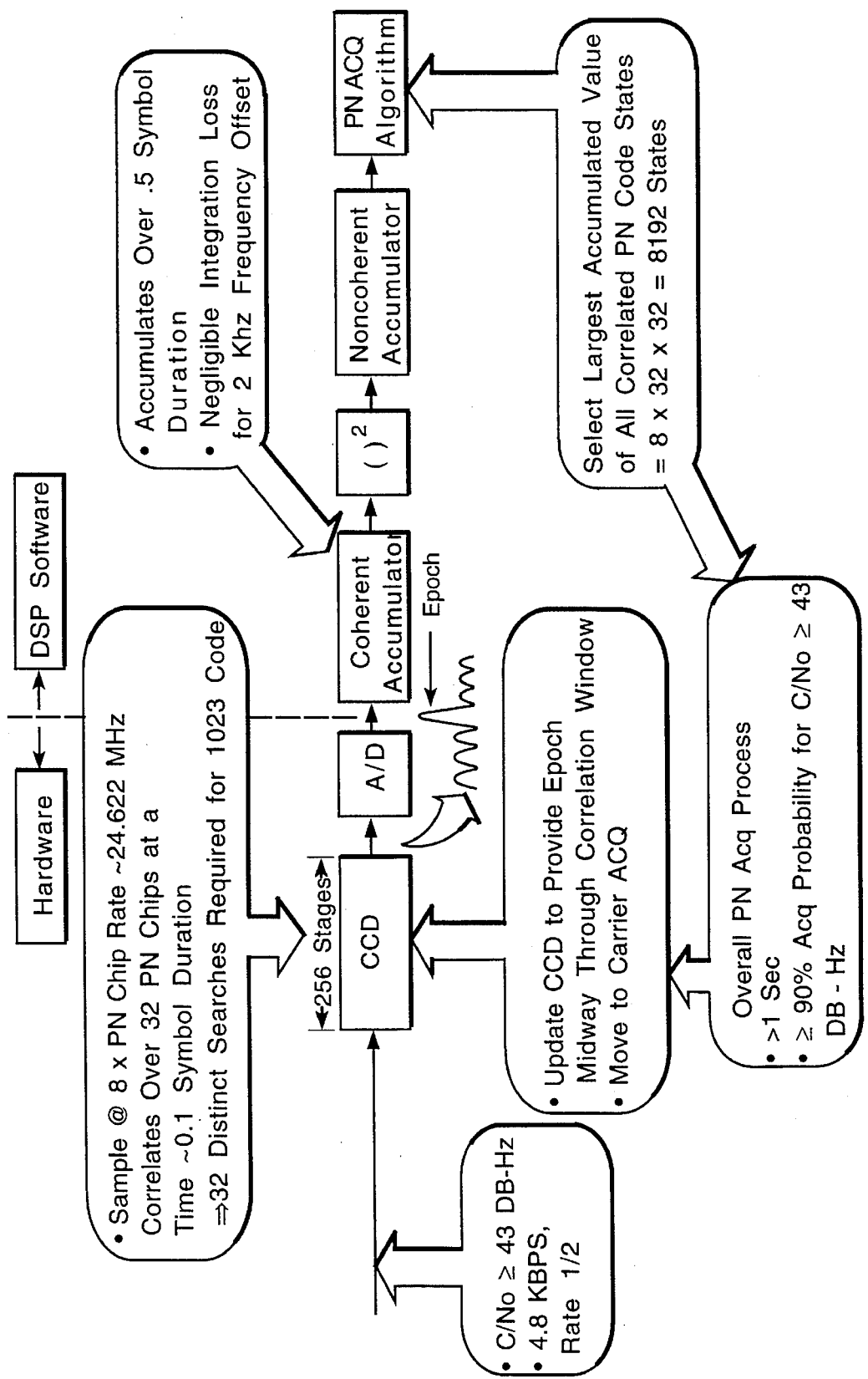
FIG. 9 illustrates an example of the PN acquisition processing performed by receiver incorporating the invention.

In the Example of FIG. 9 for a CD signal having the parameters shown in FIG. 9, the CCD is updated to provide epoch midway through the correlation window and moved to acquire the carrier. The coherent accumulator accumulates over a 0.5 symbol duration. The PN acquisition algorithm selects the largest accumulated value of all correlated PN states (8×32×32=8192 states). Parameters of the overall PN acquisition process are <1 sec and >90% acquisition probability for C/NO>43 DB—HZ. The CCD is updated to provide epoch midway through the correlation window and moves to the carrier acquisition process.

Figure 10:
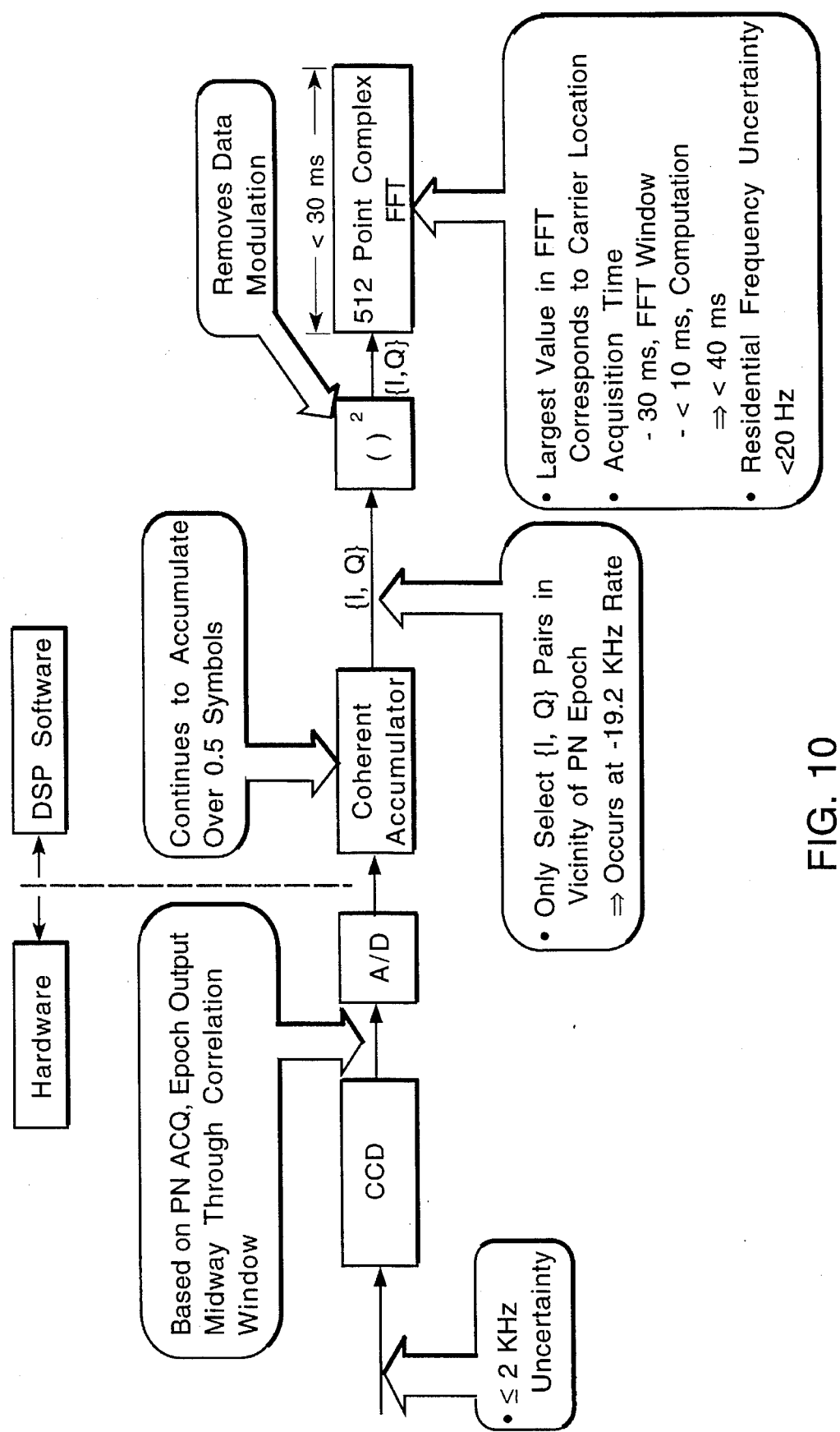
FIG. 10 illustrates the carrier acquisition processing performed by the example receiver incorporating the invention.

Carrier acquisition (diagrammatically illustrated in FIG. 10) is initiated following completion of the PN acquisition process. Inphase (I) and quadrature (Q) samples are collected and squared to remove the data modulation envelope. An FFT of the samples is then taken and the peak of the resulting spectrum is used to identify the location of the carrier. FIG. 10 depicts this process.

The coherent accumulator accumulates over ½ symbols and selects, I,Q pairs in the vicinity of the PN epoch at about 19.2 Khz rate. A squaring circuit removes data modulation and in the FET the largest value corresponds to carrier location. The acquisition time and residential frequency uncertainty are illustrated in the arrowed box.

Figure 11:
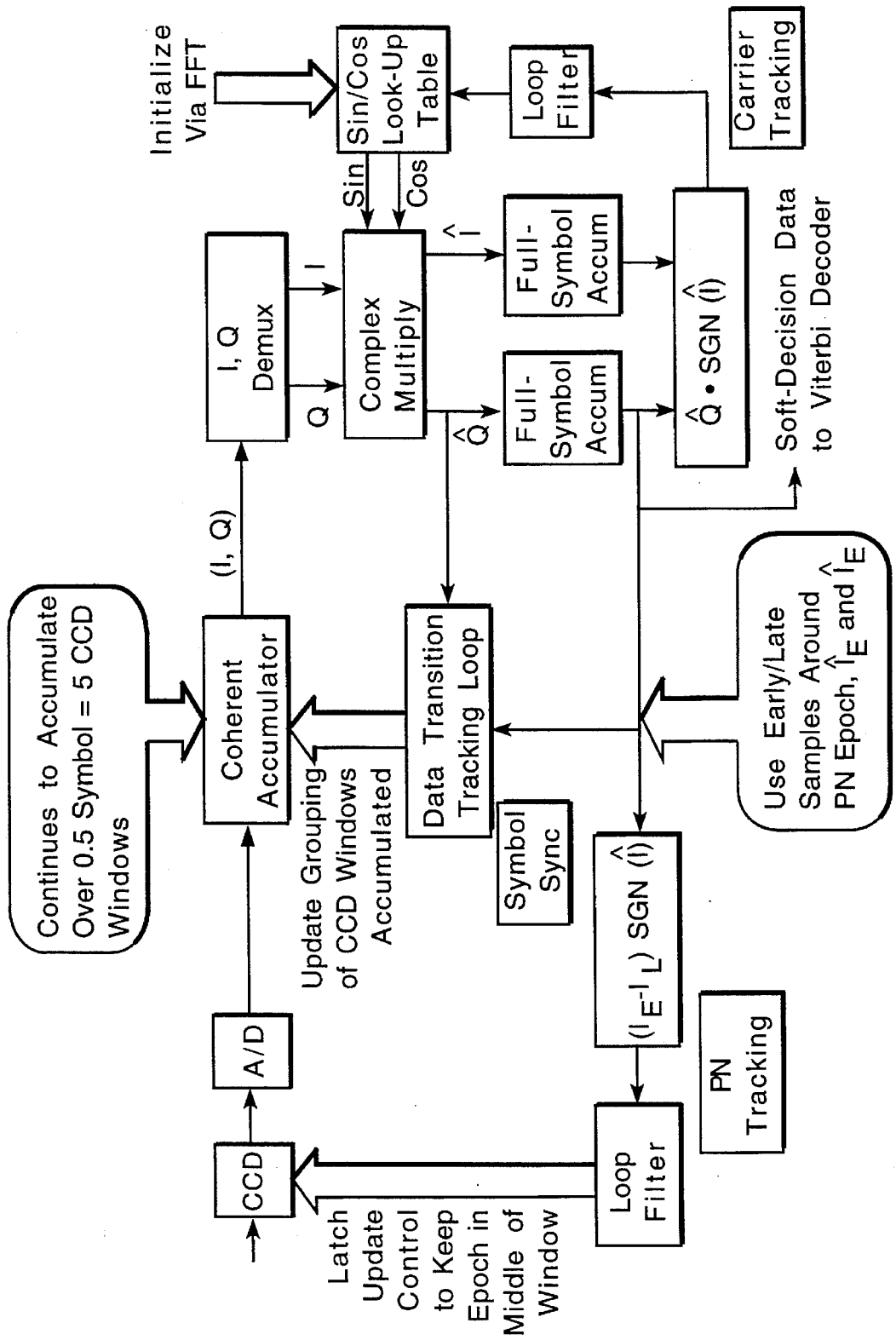
FIG. 11 illustrates the tracking signal processing performed by the example receiver incorporating the invention.
Figure 12:
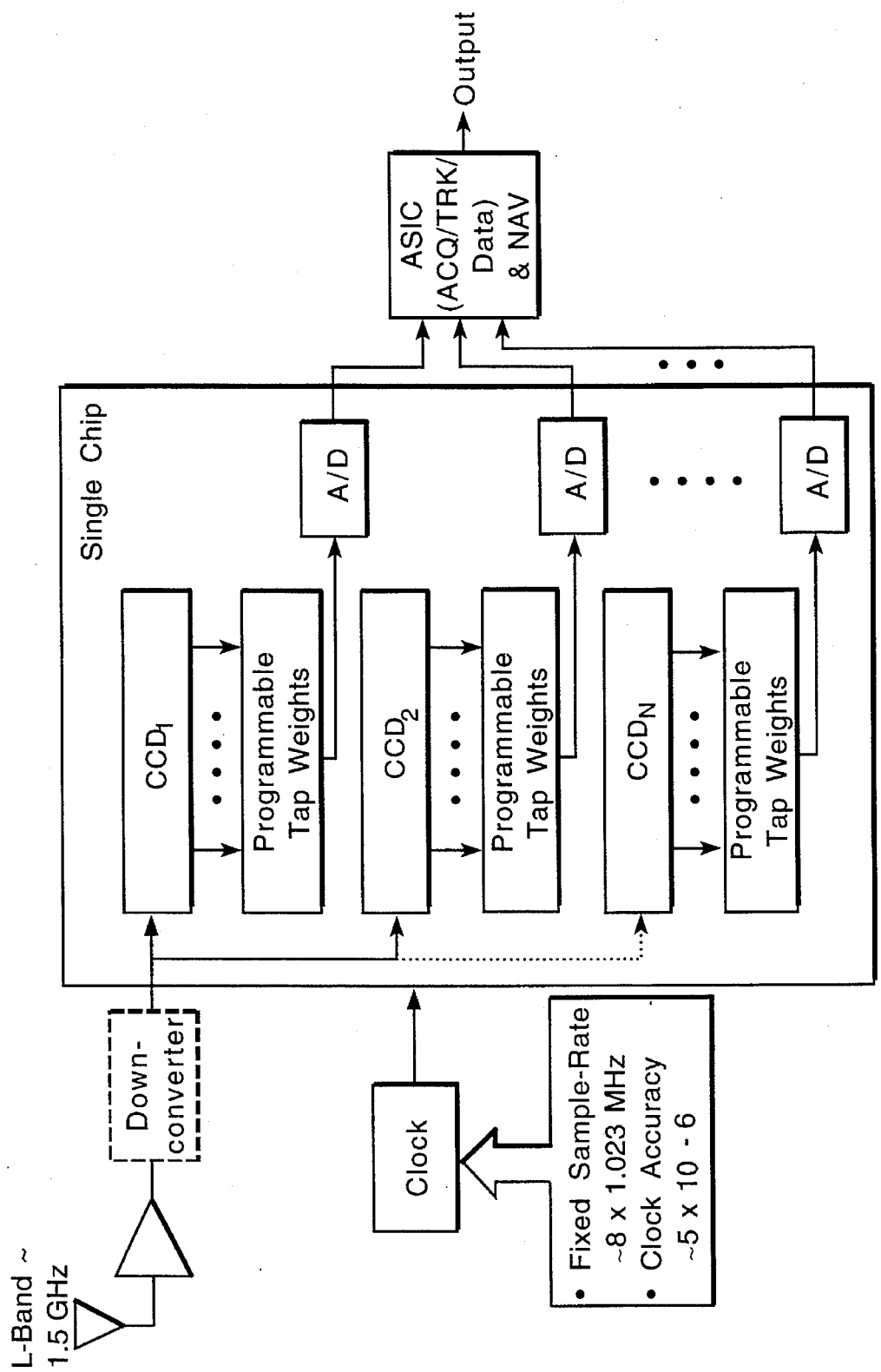
FIG. 12 is a block diagram of a CCD-based, multichannel GPS receiver incorporating the invention.
Figure 13:
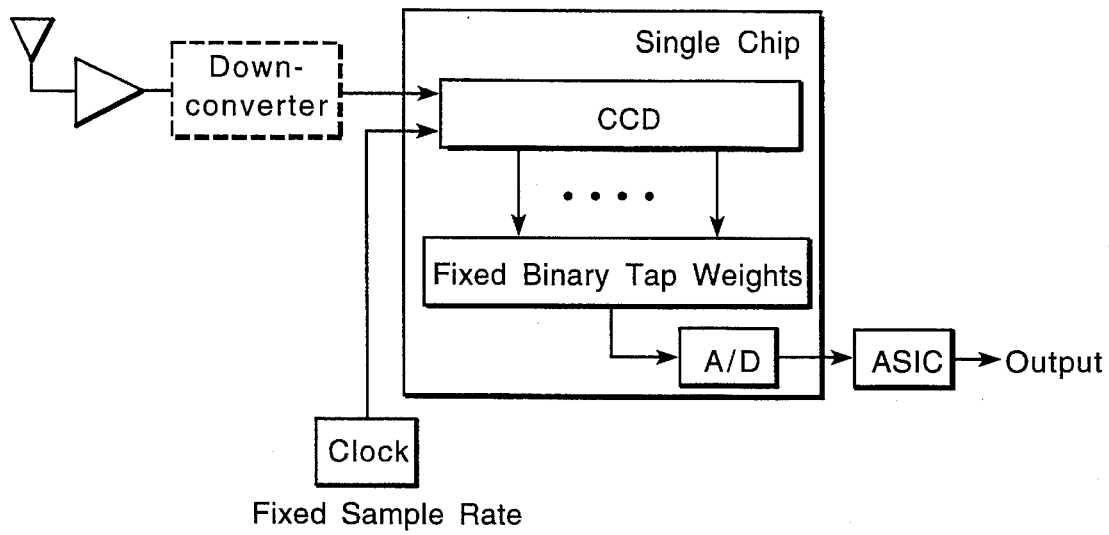
FIG. 13 is a block diagram of a CCD-based, single channel direct-sequence receiver incorporating the invention.

Once the signal is acquired, signal tracking is initiated. FIG. 11 illustrates this process in greater detail. Note that the same I,Q samples used for acquisition are used by all three (PN, carrier and symbol sync) tracking loops (These tracking loops per se are conventional in CDMA systems). These samples are first coherently accumulated in the coherent accumulator CA with the duration of the accumulation determined by the data tracking loop. Output of the accumulator is passed via demultiplexor DM to the complex multiplier CM where output from a sine/cosine look-up table C/S is used to mix with the samples. This removes the residual carrier and phase components in the recovered signal and yields coherent inphase and quadrature signals. Full symbol accumulation (ISI), (ISQ) is then performed with the symbol samples distributed to each of the three loops. A Q times sign of I discriminator DIS is used for carrier tracking while a DTTL is used for symbol tracking. The PN tracking loop $((I_E-I_L)SGN(\uparrow))$ uses the system's resolution of $\frac{1}{16}$th of a chip to direct its operation. Updates to the local PN clock are made in increments of $\frac{1}{8}$th chip duration. The updated local PN clock is used to generate the local code and sample clock which are passed back to the CCD.

Figure 14:
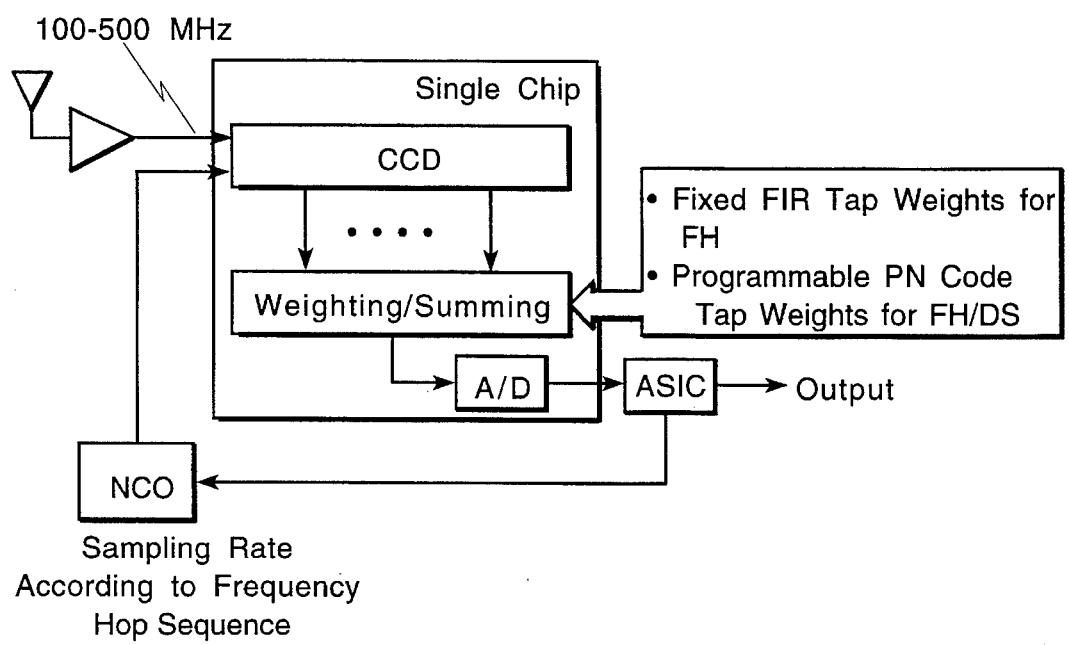
FIG. 14 is a block diagram of a CCD-based frequency hopping (FH) or frequency hopped/direct sequence (FH/DS) receiver incorporating the invention.
Figure 15:
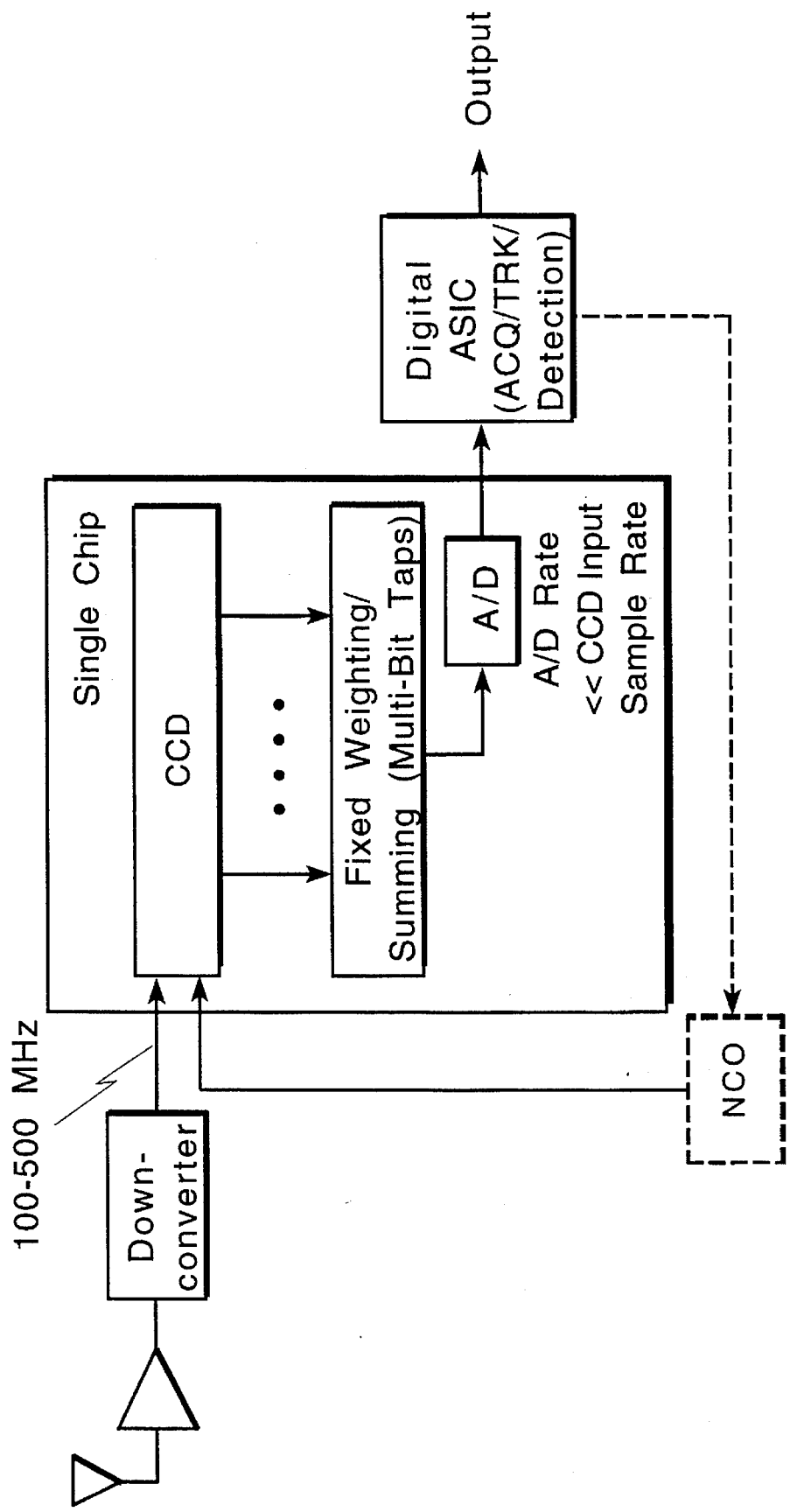
FIG. 15 is a block diagram of a CCD-based digital modem incorporating the invention.

Other examples of Integrated Receiver Application are depicted in FIGS. 12–15. Multichannel applications such as GPS (see FIG. 12) are very appropriate for CCD-based Integrated Receiver designs incorporating the invention. Each GPS receiver channel GPS1, GPS2 . . . GPSn is provided with an analog to digital converter whose outputs are processed (acquisition track data and a navigation solution) in conventional fashion to provide position information. The down conversion is illustrated as optional. Very simple direct sequence (DS) spread spectrum applications (see FIG. 13) are, as discussed in the earlier example, well suited for the IR of this invention. Frequency hopped (FH) or FH/DS receivers (see FIG. 14) may also be developed with the IR approach. Clock 13-1 provides a fixed sample rate to the CCD, and the single chip 13-2 digital output is processed for conventional fashion by ASIC 13-3. Again, the down conversion may be internal or external of the single chip 13-2. In FIG. 14, an NCO 14-1 is controlled such that the sampling rate of the HFCCD receiver is according to the frequency hop sequence of the received broadcast signals on the antenna. In the case of a direct sequence (DS), a CDMA signal the weight summer 14-5 is programmable. Flexible modem design (see FIG. 15) can also be handled according to the invention.

Transmitter design can also benefit from the CCD filtering capability. The CCD can filter, modulate, tune, spread, and amplify/attenuate the signal for the purpose of generating a waveform for supplying to a power amplifier and antenna for transmission.

Figure 16:
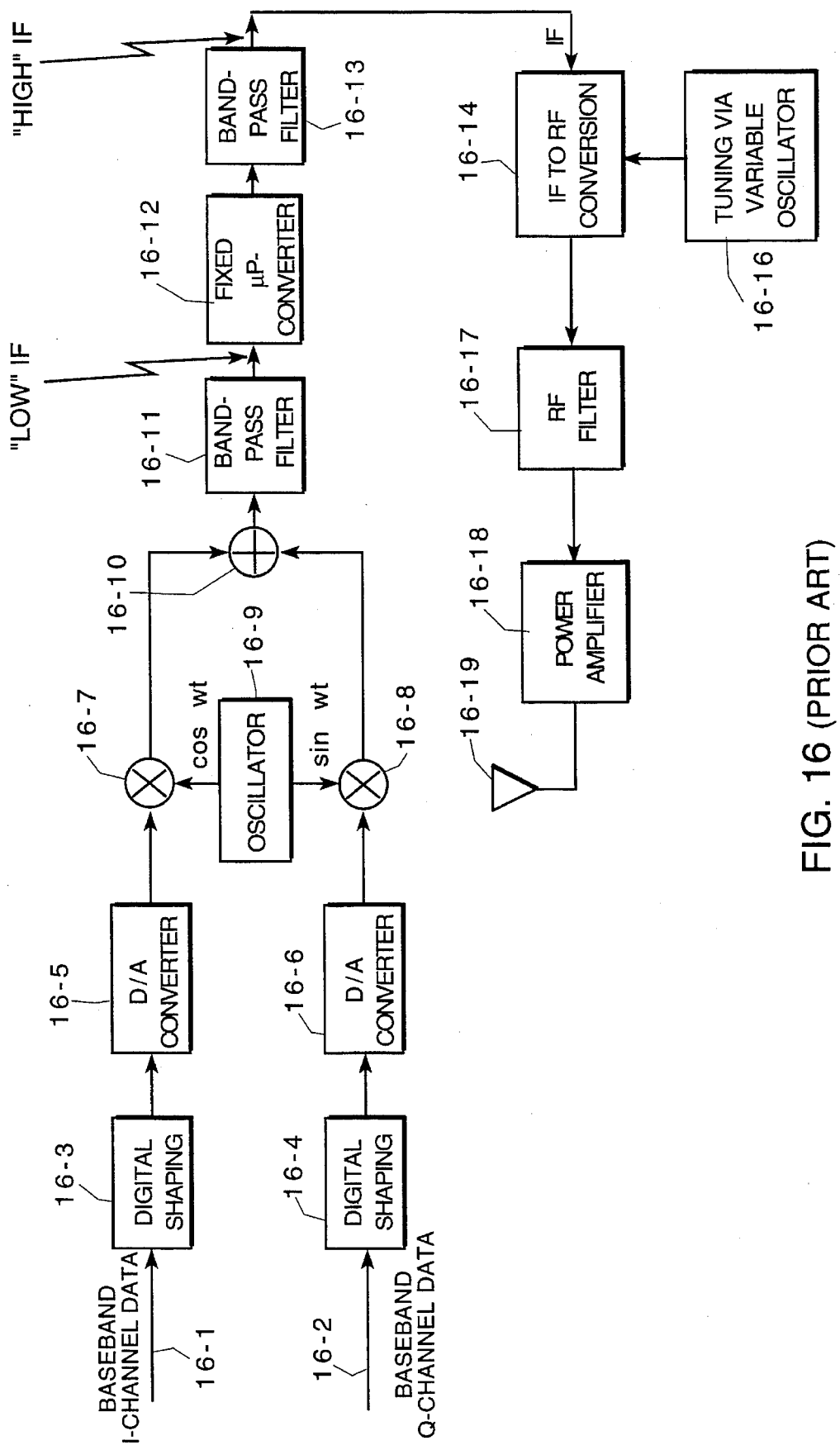
FIG. 16 illustrates a block diagram of a conventional modulator/transmitter, that incorporates quadriphase modulation, time-domain shaping of the signal waveform, and channel selection/tuning.

FIG. 16 illustrates the conventional approach (prior art) for quadriphase signal modulation, waveform shaping and tuning. Specifically, the individual I-channel and Q-channel data streams (each is a baseband sequence of 1's and 0's) are first individually processed by digital, waveform shaping circuits. This involves a combination of sampling and digital processing at a rate many times that of the data information rate, with the number of bits per sample quit high (e.g.>10) to ensure accurate shaping. This is followed by digital-to-analog (D/A) conversion, which yields an analog signal, for frequency conversion to a low IF (e.g., 10 MHz), for a system that operates in the cellular band ~ 900 MHz). Several upconversion steps then follow, which also includes tuning via a variable oscillator.

Figure 17:
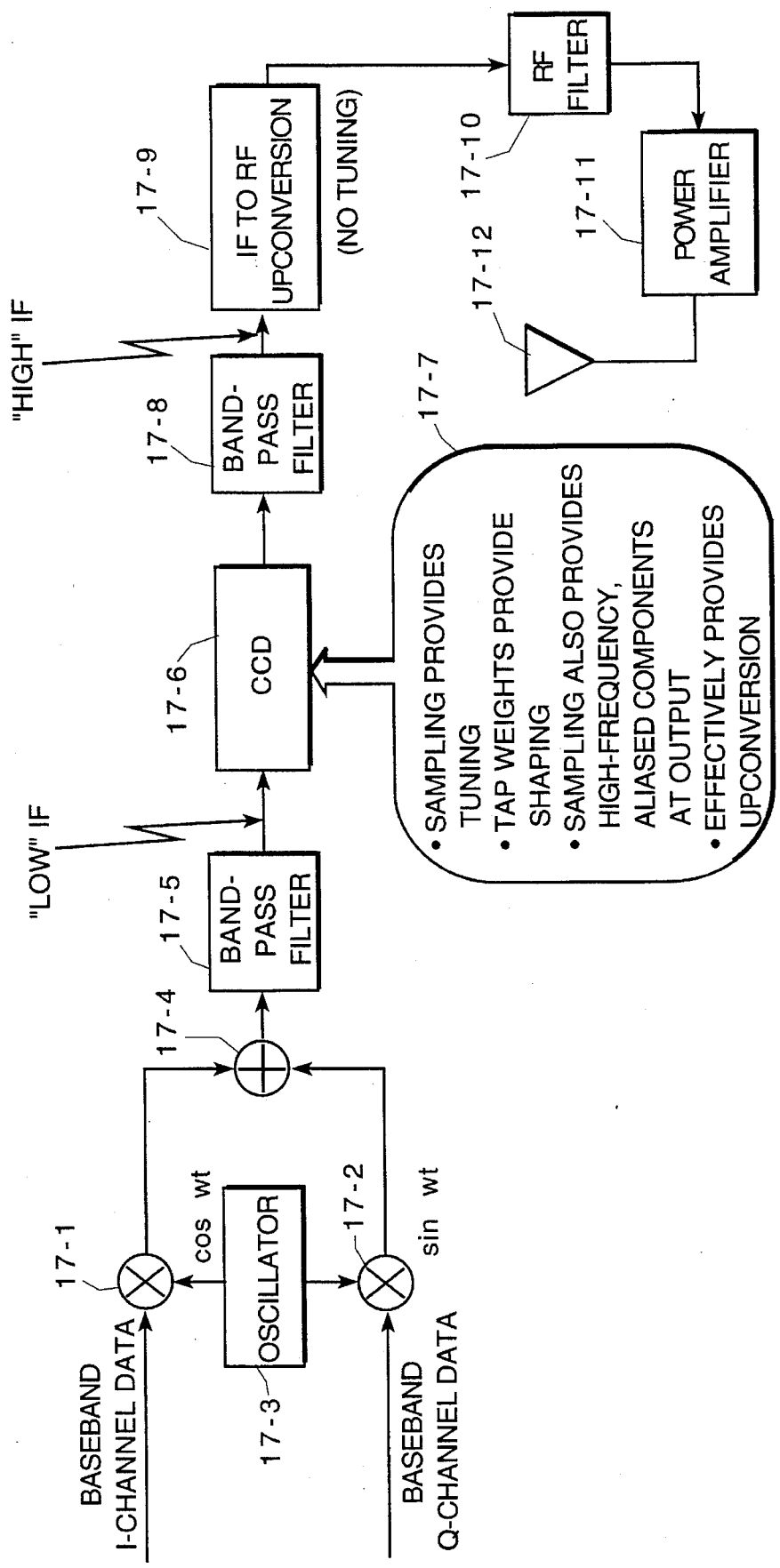
FIG. 17 illustrates a block diagram of the new CCD-based modulator/transmitter, that incorporates new, improved, and simplified waveform shaping and channel selection/tuning.

FIG. 17 illustrates the CCD-based approach according to the present invention, which is seen to significantly simplify the modulation/tuning process. Specifically, the incoming I-channel and Q-channel data streams 17-1, 17-2 are directly upconverted (oscillator 17-3 sin wt and cos wt) in mixers 17-4, 17-5) to a low IF, without digital waveform shaping and D/A conversion. The upconverted signals are added 17-6, bandpass filtered 17-7 and this low IF signal is then directly processed by the CCD 17-8, with a sampling rate approximately 4× the low IF, and with the tap weights set to provide the desired waveform shaping. The following observations apply:

The CCD 17-8 directly provides analog processing, thereby totally eliminating the digital processing of the conventional approach.

The sampling rate is selected so that output samples are precisely spaced at ¼ cycle intervals relative to the input IF (the low IF); i.e., the samples are precisely 90° apart.

The specific CCD sampling rate selected provides fine tuning around the low IF, thereby eliminating the additional tuning, at high IF, required in the conventional approach.

CCD sampling provides aliased components at the output that are spectrally spaced in accordance with the CCD sampling rate (i.e., at ~4× the low IF); this aliasing effectively provides upconversion to the desired high IF (or RF) without additional upconversion mixing—instead, all that is required is a bandpass filter at the CCD output that is centered around the desired aliased component.

In summary, the new CCD approach of FIG. 17 reduces circuitry, complexity, and power consumption, and enhances signal processing efficiency. Note that these are all significant factors for any communication system, especially for low cost commercial systems.

Figure 18:
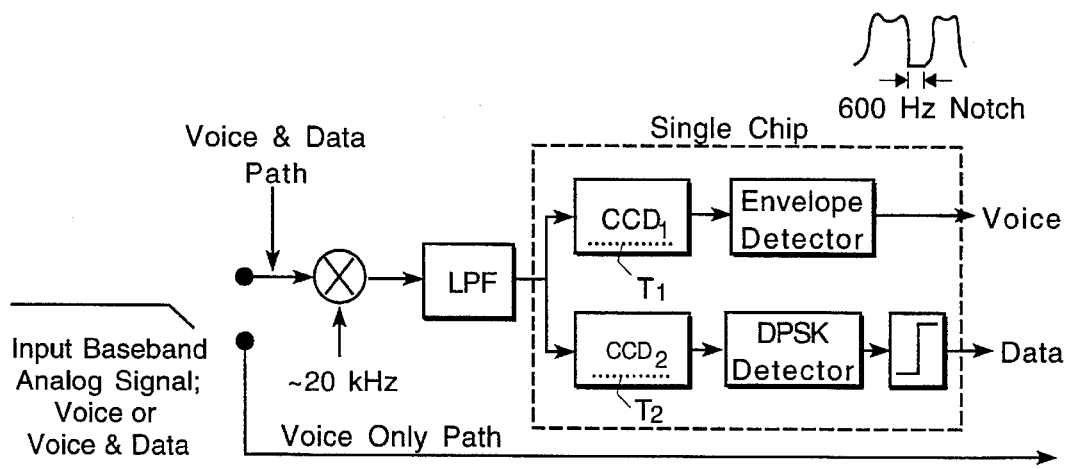
FIG. 18 is a bock diagram of the receiver portion of the data-in-voice modem of this invention.

FIG. 18 is a block diagram of a preferred embodiment of the receiver of a modem incorporating the invention. The data-in-voice modem is for coupling voice and data signals to and from a telephone circuit 18-1. As shown, an upconverter circuit for receiving input baseband signals including voice and data signals and, upconverting said baseband signals to an intermediate frequency (IF) signal which is low pass filtered 18-2. A single integrated circuit chip 18-3 has a first CCD channel 18-4 having a first CCD filter device 18-4 with indicated intermediate taps $T_1$ for IF sampling with a fixed sampling rate and predetermined tap weights. An envelope detector 18-4 is coupled to receive the output of the first CCD device 18-4, the first CCD device having a predetermined frequency notch in the passband thereof and outputing a voice signal from the first CCD channel.

A second CCD channel having a second CCD filter device 18-6 coupled to receive the intermediate frequency signal and is adapted to perform as a bandpass filter for the predetermined filter notch, IF sampling with predetermined sampling and tap weights and a phase shift keyed detector means 18-7 and filter 18-8 for outputting a data signal from the second CCD channel. Note the following features and aspects:

$CCD_1$—Bandpass filter, with ~ 600 Hz notch in passband
$CCD_2$—Bandpass filter ~ 600 Hz bandwidth in same passband
Both CCD's perform IF sampling with fixed sampling rate and fixed TAP weights
Option: Programmable TAP weights and/or sample rate to vary notch width (up to ~ 1200 Hz)
Desire is to integrate as much functionality as possible on CCD chip (e.g., including mixers)
No A/D conversion is required.

Figure 19:
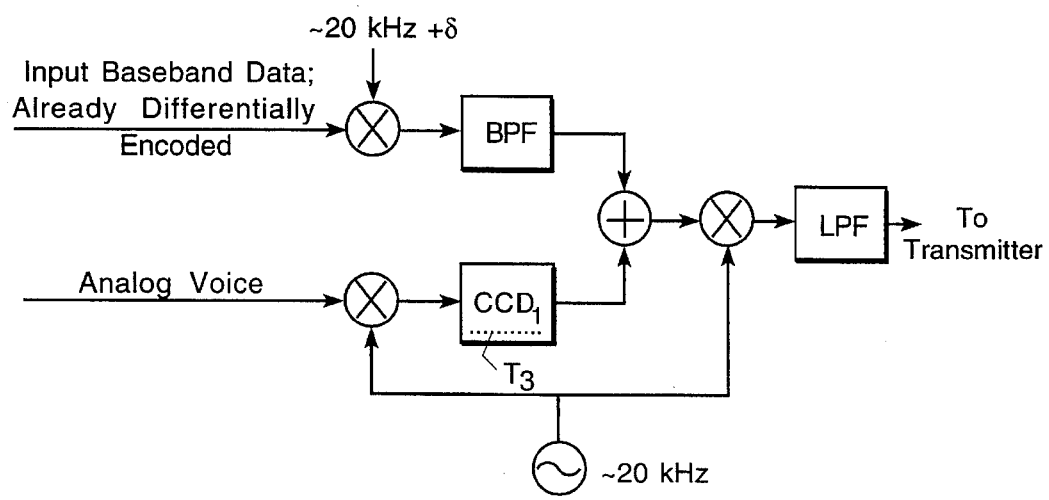
FIG. 19 is a block diagram of the modulator portion of the data-in-voice modem of this invention.

The modulator portion shown in FIG. 19 includes an analog voice signal channel 19-1 having means for upconverting the analog voice signal to a predetermined intermediate frequency IF and a third CCD 19-5 channel having a third CCD with intermediate taps $T_3$ for IF sampling with a further fixed sampling rate and predetermined tap weights. Circuit means is provided for inputting a differential phase shift key (DPSK) signal encoded data signal, an upconverter 19-4 for upconverting the DPSK signal to a predetermined intermediate signal, plus an offset, and a bandpass filter means 19-5 is connected to the upconverter 19-4. Summer means 19-6 for adding the outputs of said third CCD channel and said bandpass filter means and providing a summed output signal constituting a data-in-voice signal which is upconverter 19-7 and low pass filtered 19-8 and then the data-in-voice signal is applied to a transmitter.

Note the following further features and aspects:
$CCD_1$ is identical to $CCD_1$ of receiver,
Desire is to integrate as much functionality on CCD chip—include modulator and receive on single chip, if possible.

While preferred embodiments of the invention have been shown and illustrated, it will be appreciated that other embodiments will be readily apparent to those skilled in the art and be encompassed by the claims appended hereto.

What is claimed is:

1. A data-in-voice modem having a transmitter modulator portion and a receiver portion for coupling voice and data signals to and from a communication circuit, comprising:

the receiver portion for separating voice from data, frequency converter means for receiving input baseband signals including voice and data signals and, converting said baseband signals to an intermediate frequency (IF) signal, a single integrated circuit chip having:

a first charge coupled device (CCD) channel connected to receive converted baseband signals from said frequency converter means and having a first CCD filter device having a passband and intermediate taps for IF sampling with a fixed sampling rate and predetermined tap weights, and an envelope detector coupled to receive the output of said first CCD filter device, said first CCD filter device having a predetermined frequency notch in the passband thereof and outputting a voice signal from said first CCD channel, a second CCD channel connected to receive converted baseband signals from said frequency converter means and having a second CCD filter device coupled to receive said IF signal and adapted to perform as a bandpass filter for said predetermined frequency notch, IF sampling with predetermined sampling and tap weights and detector means for outputing a data signal from said second CCD channel.

2. A data-in-voice modem as defined in claim 1, said transmitter modulator portion having:

an analog voice signal channel having means for upconverting signals in said analog voice signal channel to a predetermined intermediate frequency IF, a third CCD channel having a third CCD filter device connected to said means for upconverting with intermediate taps for IF sampling with a further fixed sampling rate and predetermined tap weights, means for inputting a differential phase shift key (DPSK) encoded data signal, means for upconverting said DPSK encoded data signal to a predetermined intermediate signal plus an offset, bandpass filter means connected to said means for upconverting, and means for adding the outputs of said third CCD filter device channel and said bandpass filter means and providing a summed output signal constituting a data-in-voice signal and low pass filter means connecting said data-in-voice signal to a transmitter.

* * * * *